(12) United States Patent
Bhaskaran et al.

(10) Patent No.: US 6,198,318 B1
(45) Date of Patent: Mar. 6, 2001

(54) POWER-ON-RESET CIRCUIT

(75) Inventors: Suraj Bhaskaran, Austin; Shankar R. Kozhumam, Round Rock; Vijayakumaran V. Nair, Austin, all of TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/239,480

(22) Filed: Jan. 28, 1999

(51) Int. Cl.⁷ .......................... H03K 17/22; H03K 17/20
(52) U.S. Cl. .............................................. 327/143; 327/198
(58) Field of Search ................................... 327/143, 198, 327/545, 546, 142; 323/901

(56) References Cited

U.S. PATENT DOCUMENTS

| | | | |
|---|---|---|---|
| 4,902,907 | * | 2/1990 | Haga et al. ............................. 327/143 |
| 5,039,875 | * | 8/1991 | Chang ................................... 327/143 |
| 5,302,861 | * | 4/1994 | Jelinek ................................. 327/198 |
| 5,394,104 | * | 2/1995 | Lee ....................................... 327/143 |
| 5,534,804 | * | 7/1996 | Woo ...................................... 327/143 |
| 5,552,725 | * | 9/1996 | Ray et al. ............................. 327/143 |
| 5,917,255 | * | 6/1999 | Ciccone ................................ 327/143 |

* cited by examiner

Primary Examiner—Timothy P. Callahan
Assistant Examiner—Terry L. Englund
(74) Attorney, Agent, or Firm—Williams, Morgan & Amerson

(57) ABSTRACT

An apparatus is used to control a reset function of an electronic device. The apparatus includes a circuit adapted to monitor a system voltage level and deliver a control signal in response to the system voltage level falling below a first preselected value. A duration controller receives the control signal and delivers a first reset signal for a preselected duration of time after receiving the control signal. A voltage level controller receives the first reset signal, and delivers a second reset signal that persists until the system voltage rises above a second preselected magnitude.

11 Claims, 3 Drawing Sheets

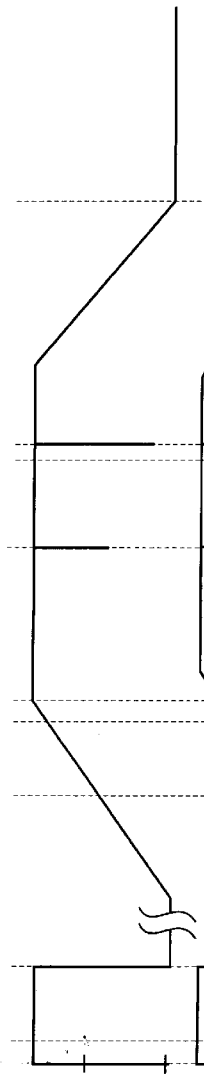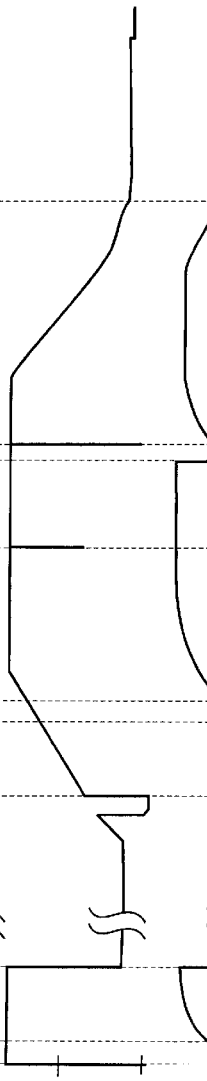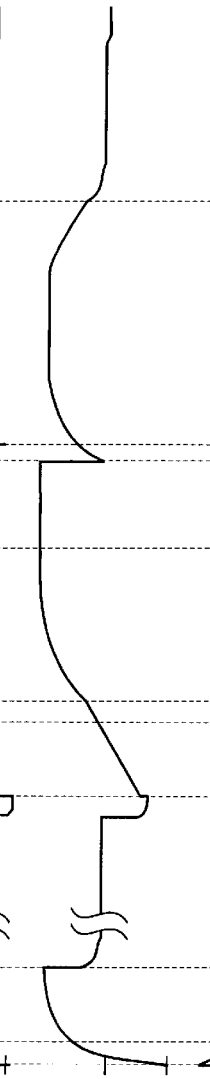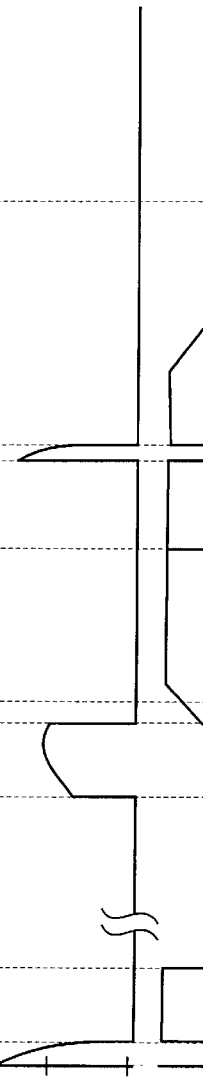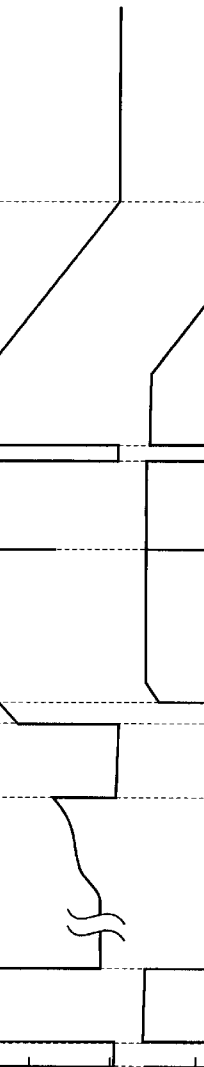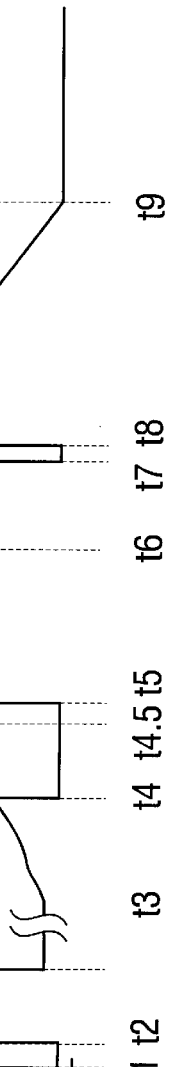

POWER-ON-RESET CIRCUIT

BACKGROUND OF THE INVENTION

1. Field of the Invention

This invention relates generally to electronic circuitry, and, more particularly, to a method and apparatus for providing a power-on-reset signal during periods of time when the power supply is activated, and/or when the voltage level of the power supply falls below a predetermined voltage level.

2. Description of the Related Art

In electronic circuits, such as CMOS or bipolar circuits, involving sequential logic design, it is often useful to initialize the states of logic elements, such as flip-flops, latches, counters, etc., to a known value when the power supply to those elements is turned on. It is also desirable to reset the states of such elements to a known value when a glitch occurs on the power supply or when the supply voltage falls below a certain threshold value. This reset signal is then turned off when supply voltage reaches a specified value. This operation is performed by what is commonly called a power-on-reset circuit A desirable power-on-reset circuit should be capable of providing a reliable reset state of sufficient duration either on power-up or when the supply voltage falls below a specified threshold value, and this reset operation should be independent of the rise and fall time of the supply voltage. Further, the power-on-reset circuit should consume minimal static current and be easy to implement in existing technologies.

The present invention is directed to providing all of the above features.

SUMMARY OF INVENTION

In one aspect of the present invention, an apparatus is provided for controlling a reset function of an electronic device. The apparatus includes a circuit adapted to monitor a system voltage level and deliver a control signal in response to the system voltage level falling below a preselected value. A duration controller is adapted to receive the control signal and deliver a first reset signal a preselected duration of time after receiving the control signal. A voltage level controller receives the reset signal. The voltage level controller passes the reset signal in response to the system voltage being greater than a preselected magnitude.

In another aspect of the instant invention, a method is provided for controlling a power-on-reset signal in response to a system voltage level being below a preselected level. The method includes: delivering a control signal indicative of a system voltage level being below a preselected level; receiving the control signal and delivering a reset signal after a preselected period of time; and receiving the reset signal and passing the reset signal in response to the system voltage level being greater than a preselected magnitude.

BRIEF DESCRIPTION OF THE DRAWINGS

The invention may be understood by reference to the following description taken in conjunction with the accompanying drawings, in which like reference numerals identify like elements, and in which:

FIGS. 4A–F are waveform diagrams associated with the schematic diagrams of FIGS. 2 and 3.

Figure 1:
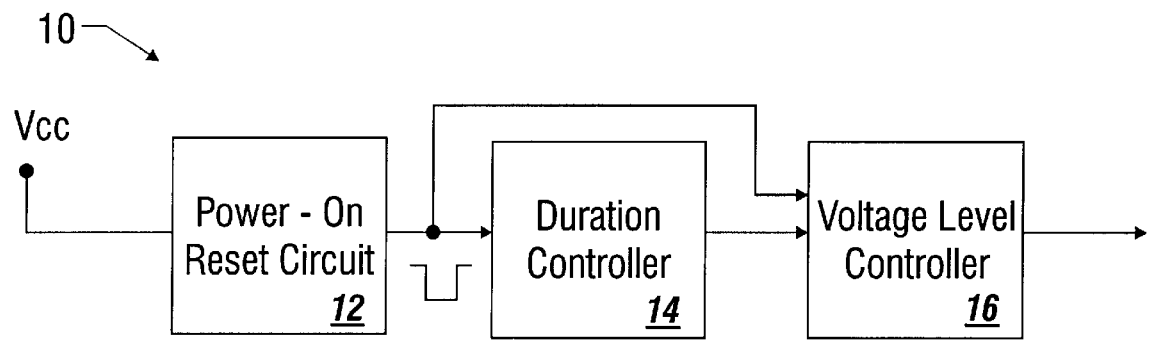
FIG. 1 is a block diagram of one embodiment of an apparatus of the power-on-reset circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular to FIG. 1, a block diagram of an apparatus 10 useful in generating a power-on-reset signal is shown. The apparatus 10 includes a power-on-reset circuit 12 adapted to monitor the voltage level of a supply voltage Vcc, and deliver a logically low pulse to an electronic circuit (not shown) in response to the supply voltage Vcc falling below a preselected level. The logically low pulse causes the electronic circuit to enter a reset mode at the conclusion of the logically low pulse to ensure that the various components in the electronic circuit are initialized to their proper levels before operation of the electronic circuit is continued. Prior to the power-on-reset signal being delivered to the electronic circuit (not shown), it is first passed through a duration controller 14 and a voltage level controller 16. The duration controller 14 ensures, under normal operating conditions, that the logically low pulse lasts for a sufficient period of time to allow the voltage level Vcc to return to an acceptable level. The voltage level controller 16 operates to ensure that the logically low pulse remains in its logically low condition until the voltage level of the supply voltage Vcc rises to a preselected level. The voltage level controller 16 will normally operate during periods of time when the supply voltage Vcc returns to its normal operating level at a substantially slowed rate. That is, when the supply voltage Vcc returns to its normal operating level at a slowed rate, such that it does not reach a desired operating voltage level within the time provided by the duration controller 14, then the voltage level controller 16 provides an additional period of time to allow the voltage level of the supply voltage Vcc to further increase.

Figure 2:
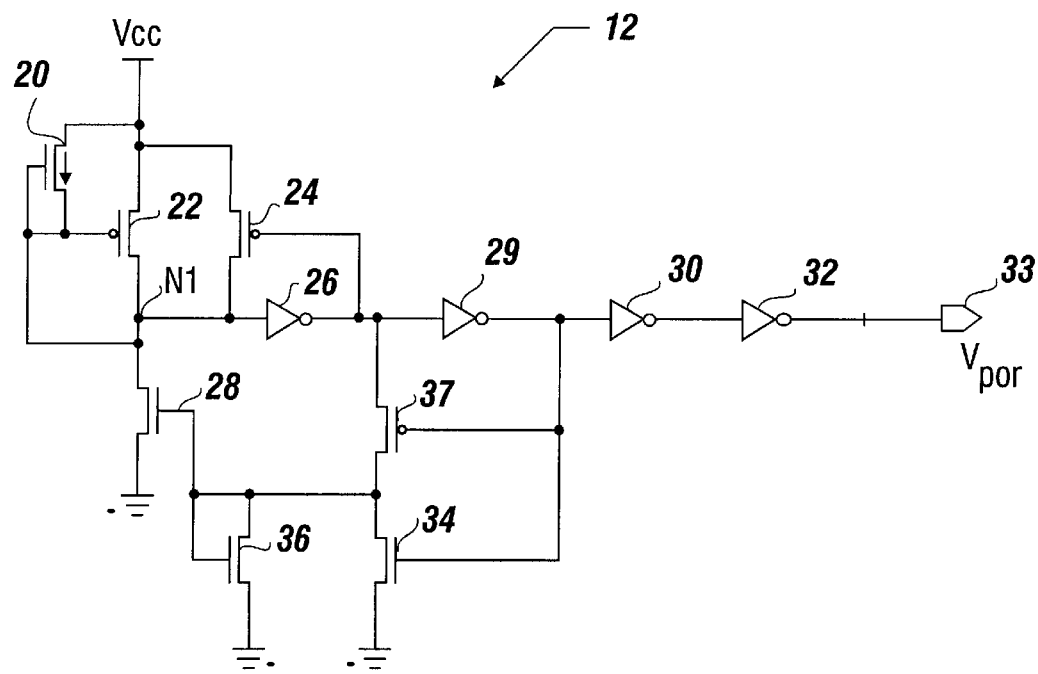
FIG. 2 is a schematic diagram of one embodiment of a power-on-reset circuit of FIG. 1.

Referring now to FIG. 2, a schematic diagram of the power-on-reset circuit 12 is shown. The power-on-reset circuit 12 is described in detail in copending U.S. patent application Ser. No. 08/387,688, filed Feb. 13, 1995, and subject to common assignment with the assignee of the instant application. The subject matter of the copending application (issued as U.S. Pat. No. 5,534,804 on Jul. 9, 1996) is hereby incorporated by reference in its entirety. A brief description of the structure and operation of the power-on-reset circuit 12 is provided herein, and additional details may be had by reference to the copending application.

The supply voltage Vcc is coupled to an n-type transistor 20 configured as a diode, and to the sources of a pair of p-type transistors 22, 24. The gate of the transistor 22 is coupled to the cathode of the diode-connected transistor 20. The drains of the transistors 22, 24 are connected to an input terminal of an inverter 26 and to the drain of an n-type transistor 28. The gate of the transistor 24 is connected to the output terminal of the inverter 26. The source of the transistor 28 is coupled to a voltage supply, such as system ground, and the gate of the transistor 28 is coupled through a diode-connected transistor 30 to a voltage supply, such as system ground. The output terminal of the inverter 26 is also coupled to a voltage supply, such as system ground, through a pair of serially connected transistors 32, 34. The transistor 32 is a p-type transistor, and the transistor 34 is an n-type transistor. The junction of the transistors 32, 34 is coupled to the gate of the transistor 28. The gates of the transistors 32, 34 are coupled to an output terminal of an inverter 29, which has its input terminal coupled to the output terminal of the inverter 26. A pair of serial inverters 30, 32 are coupled to the output terminal of the inverter 29.

The power-on-reset circuit 12 responds to the supply voltage Vcc falling to a preselected level, such as approximately system ground, by delivering a logically low signal at the output terminal of the inverter 32. When the supply voltage Vcc is at approximately system ground, a node N1 at the junction of the transistors 22, 28 is also at a voltage level of approximately system ground, or a logically low level. The transistor 28 is biased "on" by a logically high output signal from the output terminal of the inverter 26 through the feedback transistor 32 to pull the node N1 substantially to ground. The logically low level at the node N1 is communicated through the serially connected inverters 26, 29, 30, 32 to produce a logically low output signal from the power-on-reset circuit 12. As the voltage level of the supply voltage Vcc increases, the node N1 will remain at a logically low level until the voltage level of the supply voltage Vcc rises above the threshold voltage level of the transistor 22. When the voltage level of the supply voltage Vcc rises above the threshold voltage level of the transistor 22, it will begin to conduct, raising the voltage level at the node N1 to substantially the same voltage level as that of the supply voltage Vcc. Thus, the voltage level at node N1 becomes logically high, which is communicated through the serially connected inverters 26, 29, 30, 32 to produce a logically high output signal, thereby ending the logically low pulse of the power-on-reset circuit 12.

Figure 3:
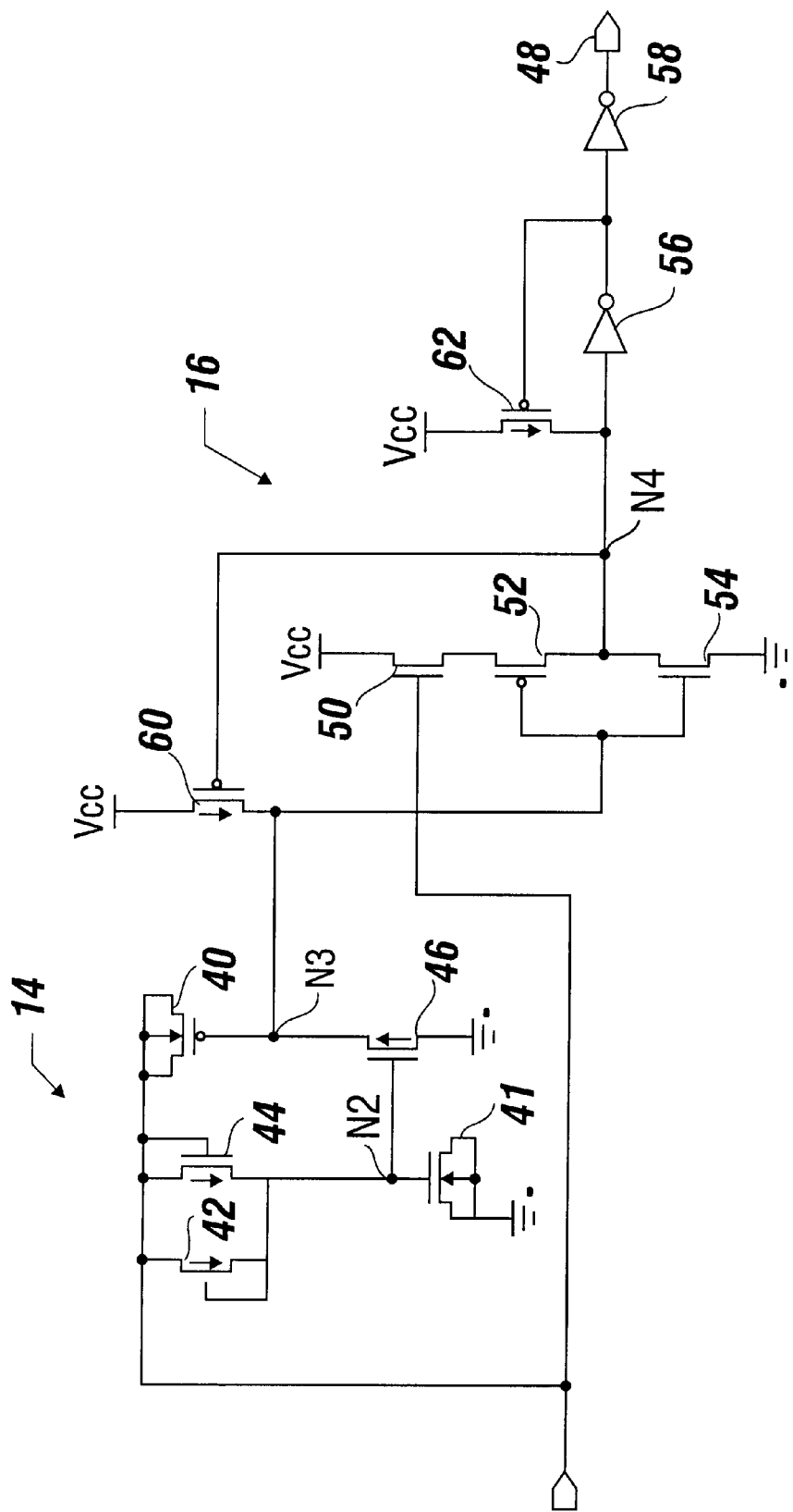
FIG. 3 is a schematic diagram of one embodiment of a duration controller and voltage level controller of FIG. 1.

Referring now to FIG. 3, a schematic diagram of the duration controller 14 and voltage level controller 16 is shown. The duration controller 14 includes a pair of transistors 40, 41 configured as capacitors by coupling their sources and drains together. The capacitor 41 is connected between a supply voltage, such as system ground, and the output terminal of the power-on-reset circuit 12 through a pair of parallel, diode-connected transistors 42, 44. A node N2 is formed at the junction of the capacitor 41 and diodes 42, 44, and is connected to the gate of an n-type transistor 46. The transistor 46 is coupled between a supply voltage, such as system ground, and the capacitor 40. A node N3 is formed at the conjunction of the transistor 46 and the capacitor 40.

In one embodiment, the capacitor 41 is substantially larger than the capacitor 40. Thus, a change in the output signal from the power-on-reset circuit 12 from a logically low level to a logically high level produces a charge on the capacitors 40, 41 at different rates. That is, the capacitor 40, owing to its smaller size, charges at a substantially faster rate than the capacitor 41. A logically low-to-high transition in the output signal of the power-on-reset circuit 12 is immediately communicated to the capacitor 40, charging the node N3 toward the voltage level of the output signal of the power-on-reset circuit 12. The diode-connected transistor 44, however, prevents charge from being placed on the capacitor 41 until the voltage level at the output of the power-on-reset circuit 12 surpasses the threshold voltage level of the diode-connected transistor 44. Thereafter, the diode-connected transistor 44 conducts current to the capacitor 41, charging the capacitor 41 at a substantially slower rate than the capacitor 40. Owing to its head start and faster charging rate, the capacitor 40 obtains a logically high level in advance of the capacitor 41 reaching the threshold voltage level of the transistor 46. Thus, a logically high signal is communicated to the voltage level controller 16, which passes and inverts the logically high signal from the duration controller 14 to produce a logically low output signal at its output terminal 48 to be delivered to the electronic circuit (not shown). Thereafter, when the voltage level stored on the capacitor 41 surpasses the threshold voltage level of the transistor 46, the transistor 46 is biased "on," pulling the node N3 toward system ground and urging the voltage level controller 16 to pass and invert the signal to produce a logically high output signal at its output terminal 48.

The duration of the logically high signal at the node N3 (and, thus, the duration of the logically low signal at the output terminal 48) depends upon the threshold voltage level of the diode connected transistor 44 and the relative sizes of the capacitors 40, 41. Varying the duration of the logically high output signal from the duration controller 14 is accomplished by varying the relative sizes of the capacitors 40, 41. That is, the larger the size of the capacitor 41, relative to the size of the capacitor 40, the longer the duration of the logically high signal at the node N3. Conversely, the smaller the size of the capacitor 41, relative to the size of the capacitor 40, the shorter the duration of the logically high signal at the node N3.

Referring now to the voltage level controller 16, an n-type transistor 50 has its source connected to the supply voltage Vcc, its gate connected to the output of the power-on-reset circuit 12 and is drain connected to ground through a pair of serially connected transistors 52, 54. The transistor 52 is a p-type transistor, and the transistor 54 is an n-type transistor connected as an inverter. The gates of the transistors 52, 54 are coupled together to the node N3, and the junction of the transistors 52, 54 is connected through a pair of serially connected inverters 56, 58 to the output terminal 48. A weak feedback path is provided through a transistor 60, having its gate connected to the output terminal of the inverter-connected transistors 52, 54, its source connected to the supply voltage Vcc and its drain connected to the node N3. The inverter 56 also has a weak feedback path through a transistor 62, having its gate connected to the output terminal of the inverter 56, its source connected to the supply voltage Vcc, and its drain connected to the input of the inverter 56.

Referring now to the operation of the voltage controller 16, a logically high output signal from the power-on-reset circuit 12 is communicated to the gate of the transistor 50 to bias it "on," providing current to the inverter connected transistors 52, 54. Initially, assuming that the voltage level appearing at the node N3 is logically high, then the transistor 54 is biased "on," pulling the input of the inverter 56 to system ground, which is communicated to the output terminal 48 as a logically low signal. After a sufficient period of time has passed, such that the node N2 has risen to a level to bias the transistor 46 "on," then the node N3 is pulled to a logically low level, which biases the transistor 52 "on." With transistors 50, 52 biased "on," the input of the inverter 56 is pulled towards the supply voltage Vcc-Vt. That is, the transistor 50 introduces a threshold voltage drop reduction to the voltage applied to the input of the inverter 56. Thus, the addition of the transistor 50 ensures that the supply voltage Vcc will rise to a higher level before a logically high voltage level is applied to the input of the inverter 56. The voltage level to which Vcc must rise before a logically high signal is applied to the input terminal of the inverter 56 can be controlled by varying the size of the transistor 50. That is, increasing the size of the transistor 50 increases the threshold voltage, thereby increasing the level to which Vcc must rise before a logically high signal is applied to the input terminal of the inverter 56.

If proper operation of the electronic circuit (not shown) that is to be connected to the output terminal 48 requires a supply voltage Vcc of a preselected magnitude, increasing the size of the transistor 50 ensures that the output signal on the terminal 48 will not transition to a logically high level until such time as the supply voltage Vcc attains a higher level commensurate with the preselected magnitude. Conversely, if the electronic circuit (not shown) operates properly at a lower supply voltage Vcc, then the size of the transistor 50 may be reduced.

Referring now to FIGS. 4A–4F, timing diagrams of the voltage levels appearing at various nodes in the duration controller 14 and voltage level controller 16 are shown. FIG. 4A illustrates the supply voltage Vcc, FIG. 4B illustrates the voltage Vpor appearing at the output of the power-on-reset circuit 12, FIG. 4C illustrates the voltage appearing at the node N2, FIG. 4D illustrates the voltage appearing at the node N3, FIG. 4E illustrates the voltage appearing at the node N4, and FIG. 4F illustrates the voltage Vout appearing at the output terminal 48.

FIGS. 4A–4F illustrate at least four scenarios in which the supply voltage Vcc is enabled or temporarily falls below a preselected voltage level. For example, in the first scenario, the supply voltage Vcc rises rapidly from system ground towards its desired voltage level. The voltage Vpor similarly rises rapidly, following Vcc, but delayed shortly in time. The node N2 begins charging slowly, owing to the size of the capacitor 41. The voltage level at the node N3 rises abruptly, owing to its relatively small capacitance. Once the voltage at the node N2 reaches the threshold voltage of the transistor 46, the node N3 rapidly discharges toward system ground. The node N4 responds to the logically low level at the node N3 and substantially immediately obtains a logically high voltage level. Likewise, the voltage Vout follows the voltage at the node N4, but is delayed in time by the transition time of the inverters 56, 58.

In the second scenario, the supply voltage Vcc begins to recover from system ground at a time T3 at a substantially slowed rate. The voltage Vpor generally follows the supply voltage Vcc, but generates a logically low pulse for a short duration of time ending at the time T4. At the end of this logically low pulse, the node N3 rapidly charges toward Vcc, reaching a logically high level, which biases the transistor 54 "on," pulling the node N4 to system ground. Likewise, the output voltage Vout follows the voltage at the node N4. The logically low signal on the node N4 biases the transistor 60 "on," further increasing the voltage at the node N3. Once the voltage level at the node N2 surpasses the threshold voltage level of the transistor 46, the node N3 is discharged to system ground, biasing the transistor 52 "on." The voltage level at the node N4 quickly rises to the voltage level Vcc-Vt, which in this example is insufficient to drive the inverter 56 to a logically low output level. Thus, the output voltage Vout remains in its logically low state beyond the time t4.5 until the supply voltage Vcc rises to a sufficiently high preselected level. At t5, Vcc has attained such a level, biasing the inverter 56 to produce a logically low output signal, which is communicated to the output terminal 48 as a logically high signal.

In the third scenario, a glitch in the supply voltage Vcc occurs at time t6. However, Vpor does not fall to a level sufficient to trigger either the duration controller 14 or the voltage level controller 16.

In the fourth scenario, a glitch in the supply voltage Vcc occurs at time t7, and in this instance Vpor falls to a level sufficient to discharge the capacitor 41, which biases the transistor 46 "off." With the transistor 46 biased "off," Vpor quickly charges the transistor 40 and the node N3 to a logically high level. The logically high level on the node N3 biases the transistor 54 "on," pulling the node N4 to system ground, which pulls the output voltage Vout to a logically low state. Because the duration of the glitch was relatively short, the capacitor 41 is not totally discharged, but rather, retains some charge. Thus, the time necessary to charge the capacitor 41 to the threshold voltage of the transistor 46 is relatively short. Once the capacitor 41 is charged to the threshold voltage of the transistor 46, the transistor 46 is biased "on," pulling the node N3 to system ground quickly. With the node N3 at a logically low level, the transistor 52 is biased "on," pulling the node N4 to Vcc-Vt. Since Vcc has quickly recovered to its desired level, the voltage level at the node N4 sufficient to drive the inverter 56, which passes a logically high signal to the output terminal 48.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus for controlling a reset function of an electronic device, comprising:

a circuit adapted to monitor a system voltage level and deliver a control signal in response to the system voltage level falling below a first preselected value;

a duration controller adapted to receive the control signal and deliver a first reset signal a preselected duration of time after receiving said control signal; and a voltage level controller for receiving said first reset signal and said control signal, said voltage level controller delivering a second reset signal in response to receiving the first reset signal and the control signal, said second reset signal persisting in response to the system voltage being less than a second preselected value.

2. A circuit, as set forth in claim 1, wherein said duration controller includes first and second storage elements adapted to charge at different rates.

3. A circuit, as set forth in claim 2, wherein said storage elements are capacitors.

4. A circuit, as set forth in claim 2, wherein said first storage element receives said control signal directly, and said second storage element receives said control signal through a voltage dropping device.

5. A circuit, as set forth in claim 4, wherein said first storage element is adapted to charge at a rate faster than said second storage element.

6. A circuit, as set forth in claim 5, including a discharge circuit adapted to discharge said first storage element in response to the second storage element being charged to a preselected voltage level.

7. A circuit, as set forth in claim 5, wherein said first reset signal corresponds to the voltage level of the charge stored on said first storage element.

8. A circuit, as set forth in claim 1, wherein said voltage level controller includes:

an inverter having a voltage source input terminal and a main input terminal, the main input terminal being coupled to the duration controller; and a transistor coupled between the voltage source input terminal of the inverter and a voltage source, said transistor having a control input terminal adapted to receive the control signal.

9. A method for controlling a power-on-reset signal in response to a system voltage level being below a first preselected level, comprising:

delivering a control signal indicative of the system voltage level being below a second preselected level;

receiving the control signal and delivering a first reset signal after a preselected period of time; and receiving the first reset signal and the control signal and delivering a second reset signal in response to receiving the first reset signal and the control signal, said second reset signal persisting in response to the system voltage level being less than the first preselected level.

10. A method, as set forth in claim 9, wherein receiving the first reset signal and delivering the second reset signal includes charging a first storage element at a first preselected rate, charging a second storage element at a second, slower preselected rate, and discharging the first storage element in response to the charge on the second storage element being greater than a preselected voltage level.

11. A method, as set forth in claim 10, including charging the first storage element with a first voltage having a first voltage level, and charging the second storage element with a second voltage having a second voltage level, said first voltage level being greater than said second voltage level.

* * * * *